United States Patent
Yeh et al.

(10) Patent No.: US 7,236,033 B2
(45) Date of Patent: Jun. 26, 2007

(54) SYSTEM AND METHOD FOR DETECTING PROCESSING SPEED OF INTEGRATED CIRCUIT

(75) Inventors: Ying Jyh Yeh, Kao Hsiung (TW); Chung Yin Fang, Hsin Chu (TW)

(73) Assignee: Silicon Integrated Systems Corp., Hsin Chu (TW)

( * ) Notice: Subject to any disclaimer, the term of this patent is extended or adjusted under 35 U.S.C. 154(b) by 0 days.

(21) Appl. No.: 11/340,755

(22) Filed: Jan. 27, 2006

(65) Prior Publication Data

US 2007/0057715 A1    Mar. 15, 2007

(30) Foreign Application Priority Data

Sep. 15, 2005    (TW) .............................. 94131918 A

(51) Int. Cl.
*H03H 11/26*    (2006.01)

(52) U.S. Cl. ...................................... 327/261; 327/262

(58) Field of Classification Search ................ 327/141, 327/211, 212, 217, 261, 262, 271, 277
See application file for complete search history.

(56) References Cited

U.S. PATENT DOCUMENTS

| 6,891,410 B2 | 5/2005 | Sadowski | 327/141 |
| 6,909,311 B2 * | 6/2005 | Foley et al. | 327/141 |

* cited by examiner

*Primary Examiner*—Linh My Nguyen
(74) *Attorney, Agent, or Firm*—Birch, Stewart, Kolasch & Birch, LLP

(57) ABSTRACT

A system for detecting the processing speed of an integrated circuit (IC) includes a flip-flop, a delay module, and a judge unit. The flip-flop receives a clock signal as a trigger signal and generates an inverted output signal. The delay module receives the inverted output signal, adjusts the delay time of the inverted output signal according to a selection signal, and outputs a delay signal to the flip-flop to have the flip-flop generate the output signal. The judge unit receives the output signal and generates a judge signal, which is enabled when the clock period of the output signal is longer than that of the clock signal.

16 Claims, 16 Drawing Sheets

SYSTEM AND METHOD FOR DETECTING PROCESSING SPEED OF INTEGRATED CIRCUIT

BACKGROUND OF THE INVENTION (a) Field of the Invention

The invention relates to a detection system and method and, more particularly, to a detection system and method capable of detecting the processing speed of an integral circuit (IC).

(b) Description of the Related Art

Typically, each IC product may tend to have a different processing speed due to different factors, e.g. the situation of the environment, the stability of temperature, etc, during the manufacturing processes. However, since all IC products in the same batch must have the same processing speed that conform to a specific specification, they must be ranked according to their respective processing speeds, and then speed compensation is made thereon to allow all IC products in the same batch to have identical processing speeds.

FIG. 1 shows a conventional detection system for detecting the processing speed of an IC. The detection system 10 includes a ring oscillator 11 built inside the IC, and an external test unit 12 built outside the IC. The external test unit 12 includes a frequency elimination device 121 and a test platform 122. Alternatively, the frequency elimination device 121 of the external test unit 12 may be built inside the IC. In a typical detection of the processing speed of the IC, the ring oscillator 11 outputs an oscillation frequency signal Hf, which is in positive correlation to the processing speed, to the external test unit 12 to allow the test unit 12 to detect the processing speed of the IC. Then, all ICs in the same batch are ranked according to their respective processing speeds, and, subsequently, the speed compensation is made thereon.

However, though the ring oscillator 11 and the external test unit 12 together may accurately detect the processing speed of an IC, the frequency of the oscillation frequency signal Hf, about 1 GHz to 2 GHz, is considerably high. Since a typical test platform may increase its detecting frequency range up to only several hundreds of MHz, the frequency elimination device 121 that consists of multiple frequency eliminators 1211 is additionally required to lower the frequency of the oscillation frequency signal Hf to an accepted detection range for the test platform 122.

Further, since the test platform becomes more expensive as a broader detecting frequency range is provided, the cost of the test platform is reduced when the frequency of the oscillation frequency signal Hf is lowered. Thus, the number of the frequency eliminators 1211 must be increased to the extent that up to more than three, such as five or ten frequency eliminators 1211. However, it is clearly seen that the overall cost and power consumption of the test unit 12 are elevated as the number of the frequency eliminators 1211 is increased. Besides, in case the numerous frequency eliminators 1211 are built inside an IC, the occupied space of an IC will inevitably expand.

On the other hand, the ring oscillator 11 and the external test unit 12 that operate at a high frequency may also result in high power consumption.

BRIEF SUMMARY OF THE INVENTION

Hence, an object of the invention is to provide a detection system and method capable of accurately detecting the processing speed of an integral circuit (IC) in an efficient way where the design complexity, production cost, and power consumption are all reduced.

According to the invention, the detection system includes a flip-flop, a delay module, and a judge unit. The flip-flop receives a reset signal that sets an output signal of the flip-flop to a preset voltage level (logic 1 or 0(a high level 1 or a low level 0)) and receives a clock signal as a trigger signal, and an inverted output signal is generated via its inverted output port. The delay module receives the inverted output signal, adjusts the delay time of the inverted output signal according to a selection signal, and outputs a delay signal whose delay time is variable to the flip-flop. Then the flip-flop generates the output signal according to the delay signal. Finally, the judge unit receives the output signal and generates a judge signal. When the clock period of the output signal is longer than the clock period of the clock signal, the judge signal is enabled by the judge unit. This indicates that the present delay time is exactly the delay time in positive correlation to the processing speed of the IC, and therefore the desired processing speed of the IC can be obtained according to the present delay time.

Further, the subject invention also provides a detection method for detecting the processing speed of an IC. First, a clock signal is provided and an inverted output signal is generated according to the clock signal. Then, the time of the inverted output signal is adjusted or delayed to generate an output signal according to a selection signal. Finally, a judge signal is provided where it is enabled when the clock period of the output signal is longer than the clock period of the clock signal.

Through the design of the invention, since the detection system of the invention requires only one flip-flop, and a clock signal rather than a high-frequency signal is used for the speed detection, the design complexity, production cost, and power consumption are all reduced.

DETAILED DESCRIPTION OF THE INVENTION

Figure 1:
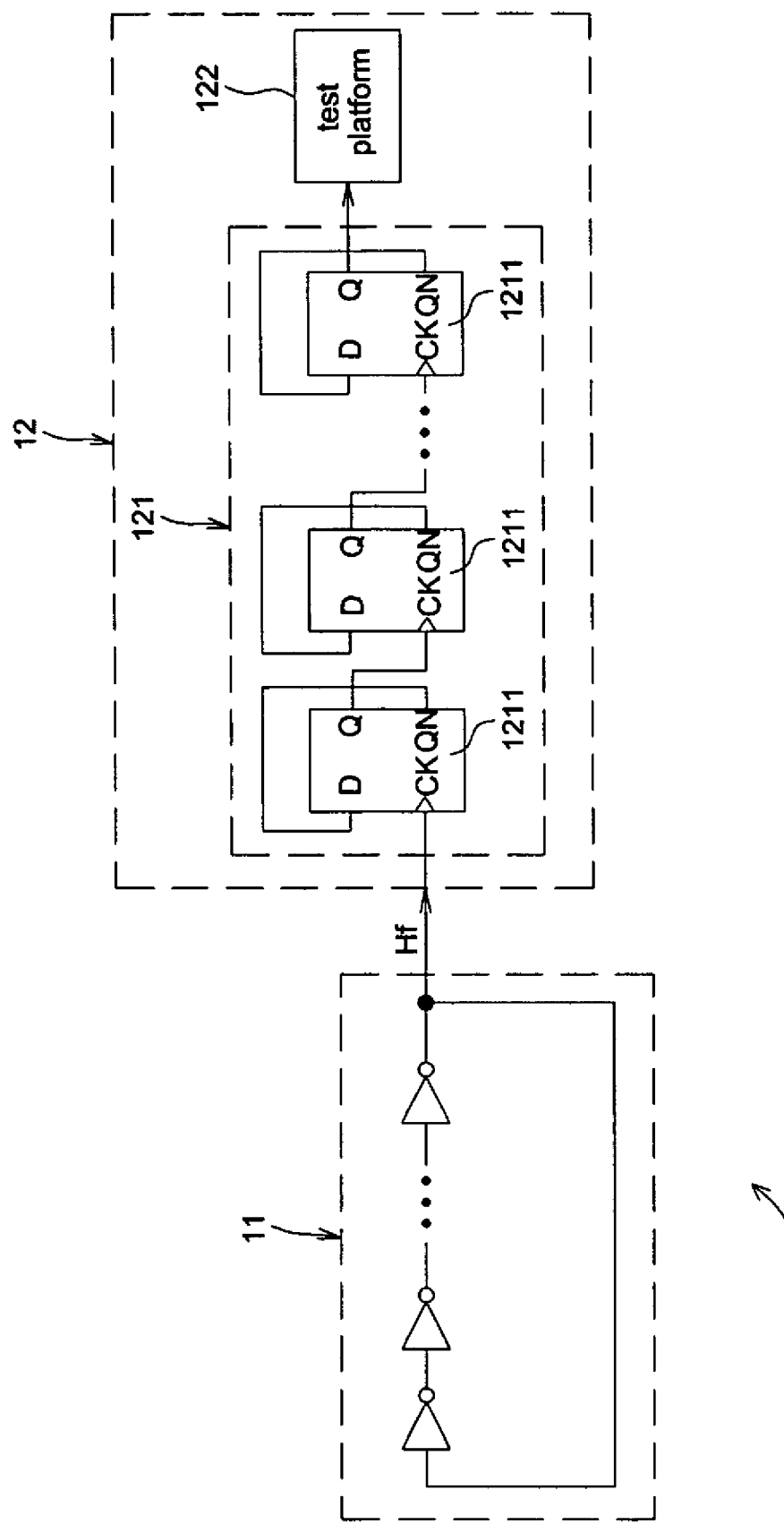
FIG. 1 shows a conventional detection system for detecting the processing speed of an IC.
Figure 2:
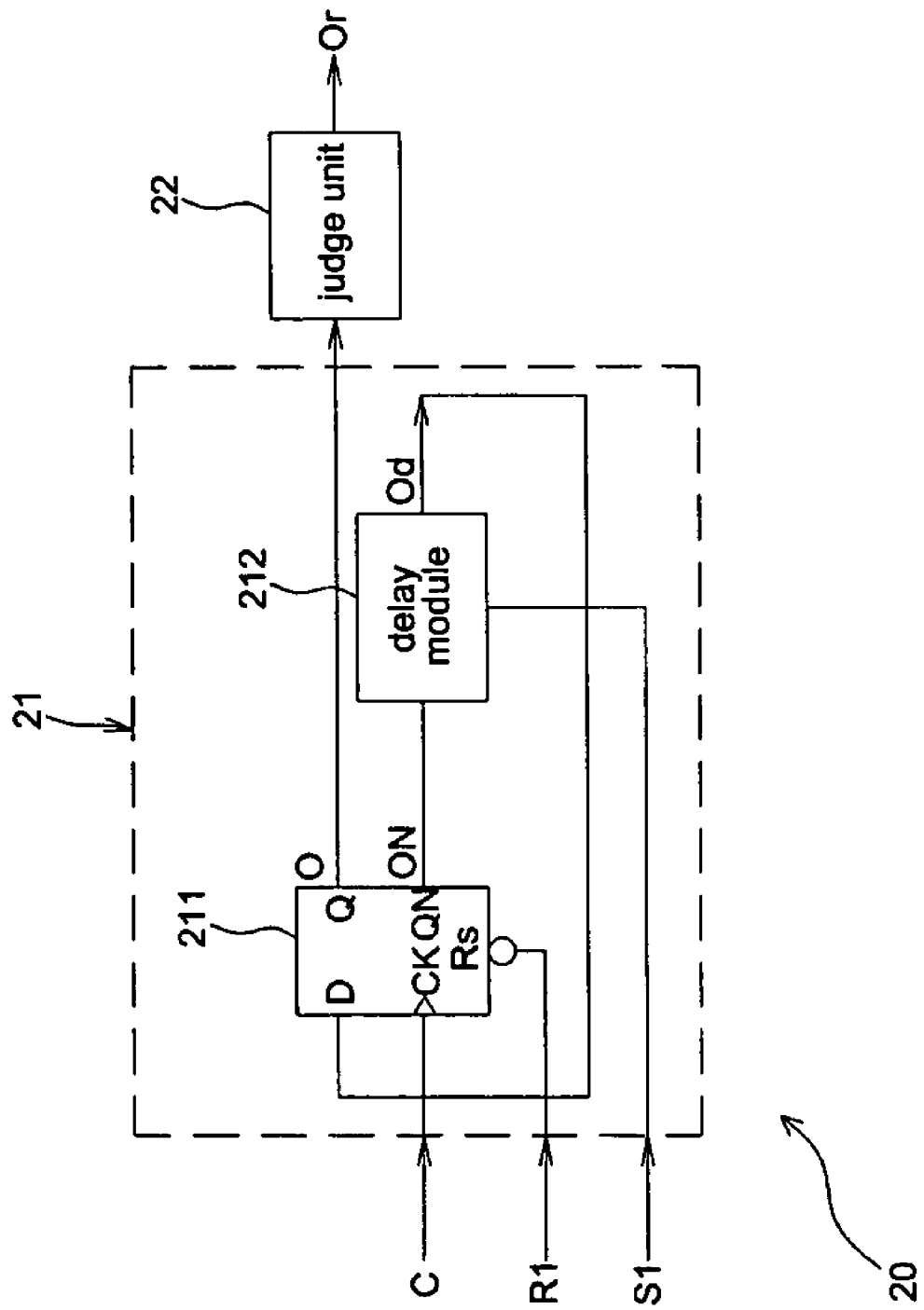
FIG. 2 shows a schematic diagram illustrating a detection system of the invention for detecting the processing speed of an IC.

FIG. 2 shows a schematic diagram illustrating a detection system 20 of the invention for detecting the processing speed of an IC. The detection system 20 includes a clock output device 21 and a judge unit 22. The clock output device 21 of this embodiment is built inside the IC and used for outputting a signal in positive correlation to the processing speed. The judge unit 22 checks the clock status of the signal to detect the processing speed of the IC. Note that the judge unit 22 of the invention can be easily built inside the IC for its simplified and compact design.

The clock output device 21 of this embodiment includes a flip-flop 211 and a delay module 212. The flip-flop 211 includes an input port D, a timing port CK, an output port Q, an inverted output port QN, and a reset port RS. In this embodiment, the timing port CK is a falling-edge trigger port. Alternatively, the timing port CK may be a rising-edge trigger port. The reset port RS receives a reset signal R1 to set the output signal O of the flip-flop 211 to a preset level (logic 1 or 0(a high level 1 or a low level 0)). The flip-flop 211 receives a clock signal C as a trigger signal via the timing port CK and outputs an inverted output signal ON via the inverted output port QN.

Figure 3:
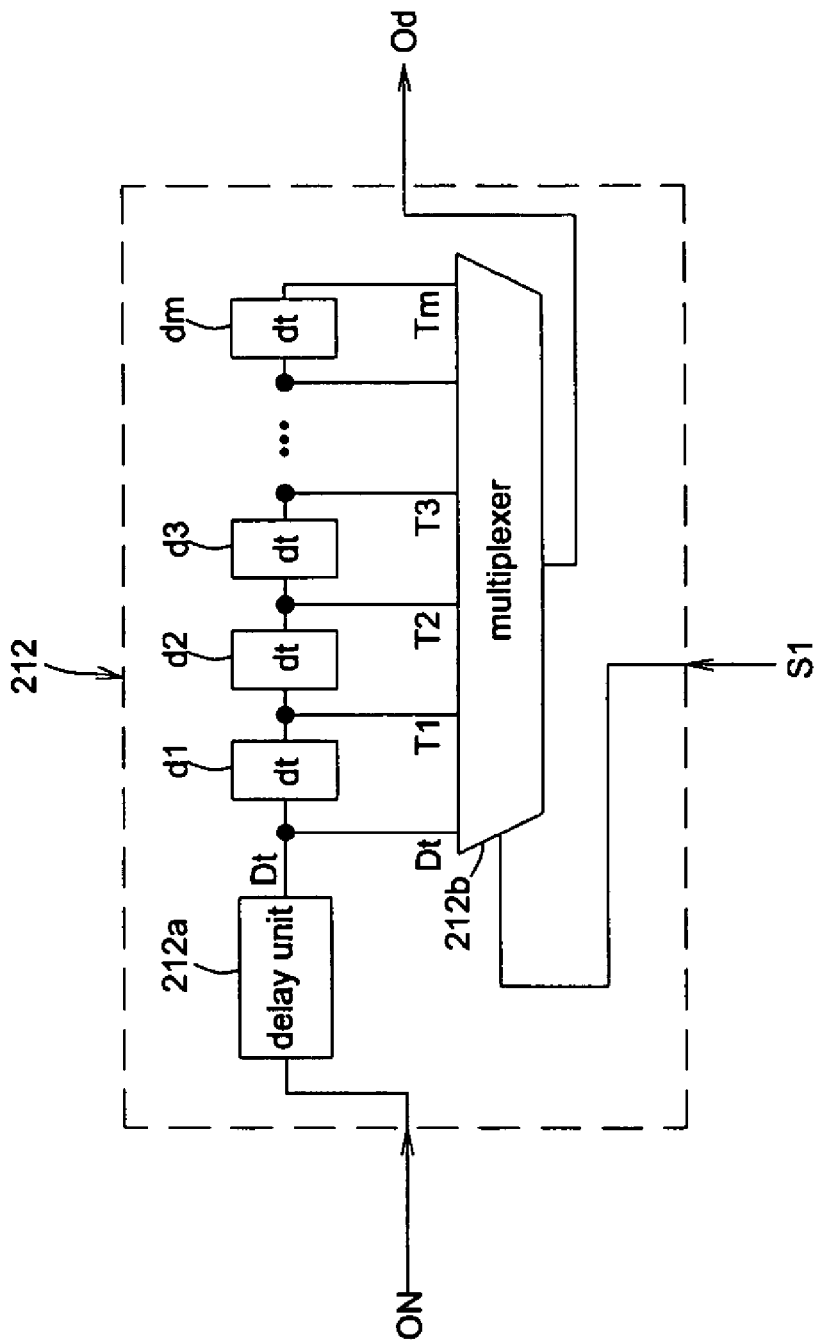
FIG. 3 shows a schematic diagram illustrating a delay module of the invention.

The delay module 212 receives the inverted output signal ON, adjusts the delay time of the inverted output signal ON according to a first selection signal S1, and then outputs a delay signal Od to the input port D of the flip-flop 211. Wherein the delay time of the inverted output signal ON is variable. So that the flip-flop 211 is allowed to output an output signal O. Referring to FIG. 3, the delay module 212 includes a delay unit 212a, m clock-adjusting units (d1, d2, d3 . . . dm, where m is a positive integer), and a first multiplexer 212b. The delay unit 212a coarsely adjusts the delay time, while the m clock-adjusting units d1-dm could finely adjust the delay time. The delay unit 212a receives the inverted output signal ON of the flip-flop 211 and delays the inverted output signal ON to generate a delay clock signal Dt. The first clock-adjusting unit d1 receives and then delays the delay clock signal Dt to generate a first clock-adjusting signal T1, where the total delay time of the first clock-adjusting signal T1 equals Dt+1dt (Dt is far longer than dt). The clock-adjusting unit may be constructed by a delay cell, multiple serially coupled NOT gates, or other device capable of delaying signals. The $m_{th}$ clock-adjusting unit dm receives and then delays the $(m-1)_{th}$ clock-adjusting signal T(m−1) to generate the $m_{th}$ clock-adjusting signal Tm. For example, the second clock-adjusting unit d2 receives and then delays the first clock-adjusting signal T1 of the first clock-adjusting unit to generate a second clock-adjusting signal T2(=Dt+2dt), and so on. In this embodiment, the delay time of each of the clock-adjusting units d1–dm equals 1dt. However, the length of delay time is not limited and is selected according to designer's actual demand. Specifically, under the condition that a fixed sum of an overall delay time caused by all clock-adjusting units is given, if the number of the clock-adjusting units increases, the delay time dt for each clock-adjusting unit is reduced, and the detection accuracy of the detection system is increased as a result. The first multiplexer 212b receives the delay clock signal Dt and m clock-adjusting signals T1–Tm and selects either the delay clock signal Dt or one of the clock-adjusting signals T1–Tm according to a first selection signal S1 to generate the aforesaid delay signal Od.

The judge unit 22 receives the output signal O of the flip-flop 211 and generates a judge signal Or. When the clock period of the output signal O is longer than that of the clock signal C, the judge unit 22 enables the judge signal Or to allow it to have a high level 1(otherwise, the judge unit 22 disables the judge signal Or to allow it to have a low level 0), which indicates the present delay time adjusted by the delay module 212 is exactly the delay time in positive correlation to the processing speed of the IC, and therefore the desired processing speed of the IC can be obtained according to the delay time. Specifically, under the circumstance that each IC has a different processing speed, the test criterion of the invention is established on an identical output result for each IC where the clock period of the output signal O is lager than that of the clock signal C. Hence, an IC with a faster processing speed requires a shorter time to obtain the same result, and thus a longer delay time is needed. On the contrary, an IC with a slower processing speed requires a longer time to obtain the same result, and thus a shorter delay time is needed. Therefore, a positive correlation between the required delay time and the procession speed is established and exactly reflects the actual procession speed of an IC.

Figure 4A:
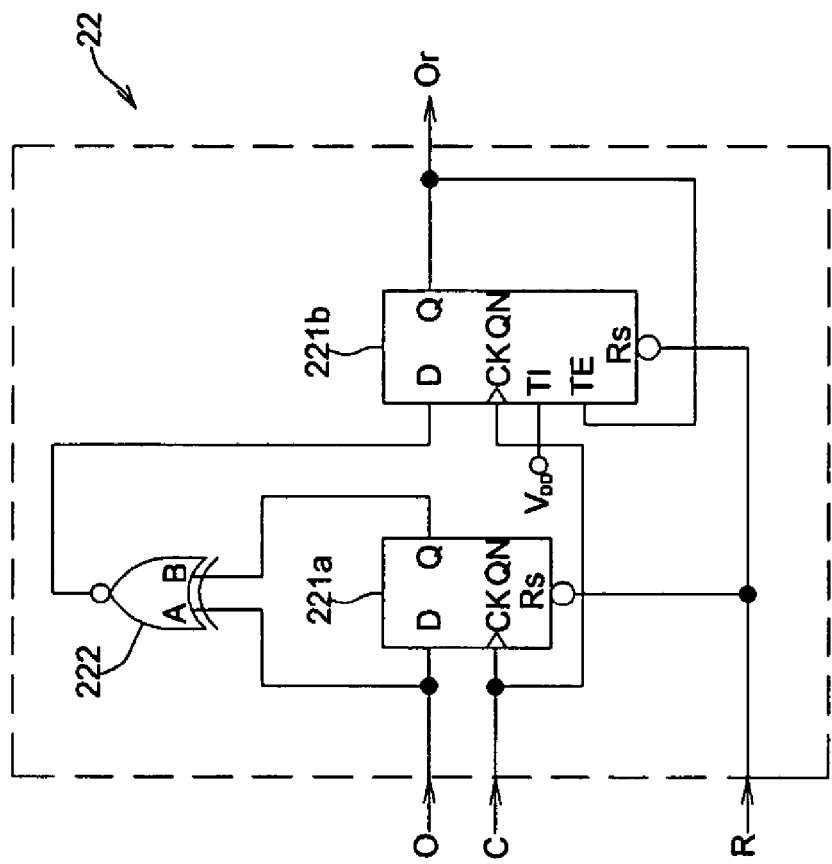
FIG. 4A shows a schematic diagram illustrating a judge unit of the invention.

Note that the judge unit 22 includes, but is not limited to, logic gates or a flip-flop, and any logic unit capable of comparing the clock period of the output signal O with that of the clock signal C can also be used. For example, as shown in FIG. 4A, the judge unit 22 may include a flip-flop 221a, a flip-flop 221b with a built-in multiplexing function, and an exclusive NOR gate 222. The flip-flop 221b is different to the flip-flop 221a in that the former further includes an output signal control end TI and a selection signal end TE. When the selection signal end TE receives the high level 1, the judge signal Or outputted via the output port Q may have a level identical with that of the output signal control end TI, which is in connection with VDD having the high level 1. On the contrary, when the selection signal end TE receives the low level 0, the judge signal Or outputted via the output port Q may have a level identical with that of the input port D. Referring to FIG. 4A, when the clock period of the output signal O is equal to or shorter than that of the clock signal C, two input ends A and B of the exclusive NOR gate 222 alternatively receive the output signal O and an output signal of the flip-flop 221a having a sequence of alternate high and low levels, so that the exclusive NOR gate 222 may output a signal having the low level 0 to the flip-flop 221b. In that case, the flip-flop 21b may output the judge signal Or having the low level 0 without being influenced by the output signal control end TI. On the contrary, when the clock period of the output signal O is larger than that of the clock signal C, the output signal O and an output signal of the flip-flop 221a received by the two input ends A and B of the exclusive NOR gate 222 may have the same high or low level, so that the exclusive NOR gate 222 may output a signal having the high level 1 to the flip-flop 221b. In that case, the flip-flop 21b may output the judge signal Or having the high level 1 with being influenced by the output signal control end TI. Certainly, the flip-flop 221b with a built-in multiplexing function may be replaced by a common flip-flop 221, for the multiplexing function is incorporated to merely achieve a more accurate result. Hence, compared to a conventional external test unit 12 that requires at least three flip-flops as frequency eliminators 1211, the judge unit 22 of the invention requires only two flip-flops. Besides, the clock output device 21 outputs a clock signal rather than a high-frequency signal to the judge unit 22 for the speed detection, and thus design complexity and production cost for a test platform and power consumption during operation are all reduced.

Figure 4B:
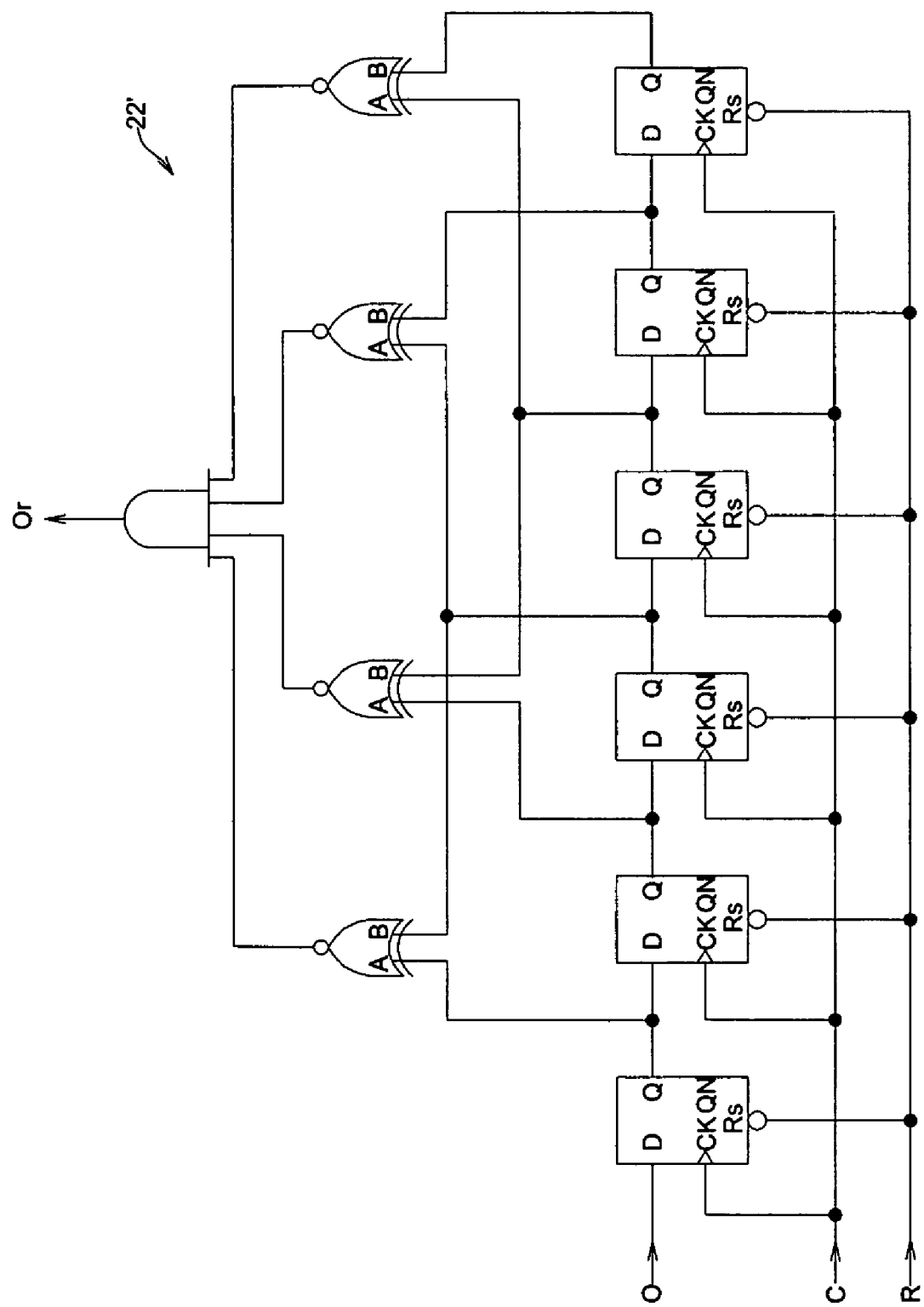
FIG. 4B shows a schematic diagram illustrating another judge unit of the invention.

FIG. 4B illustrates another embodiment of the judge unit according to the invention, where a judge unit 22' includes six flip-flops, four exclusive NOR gates, and a AND gate. Though the number of the flip-flops is larger than that shown in FIG. 4A, it still can reduce the design complexity and production cost for a test platform 122 since a clock signal rather than a high-frequency signal is employed.

Figure 5A:
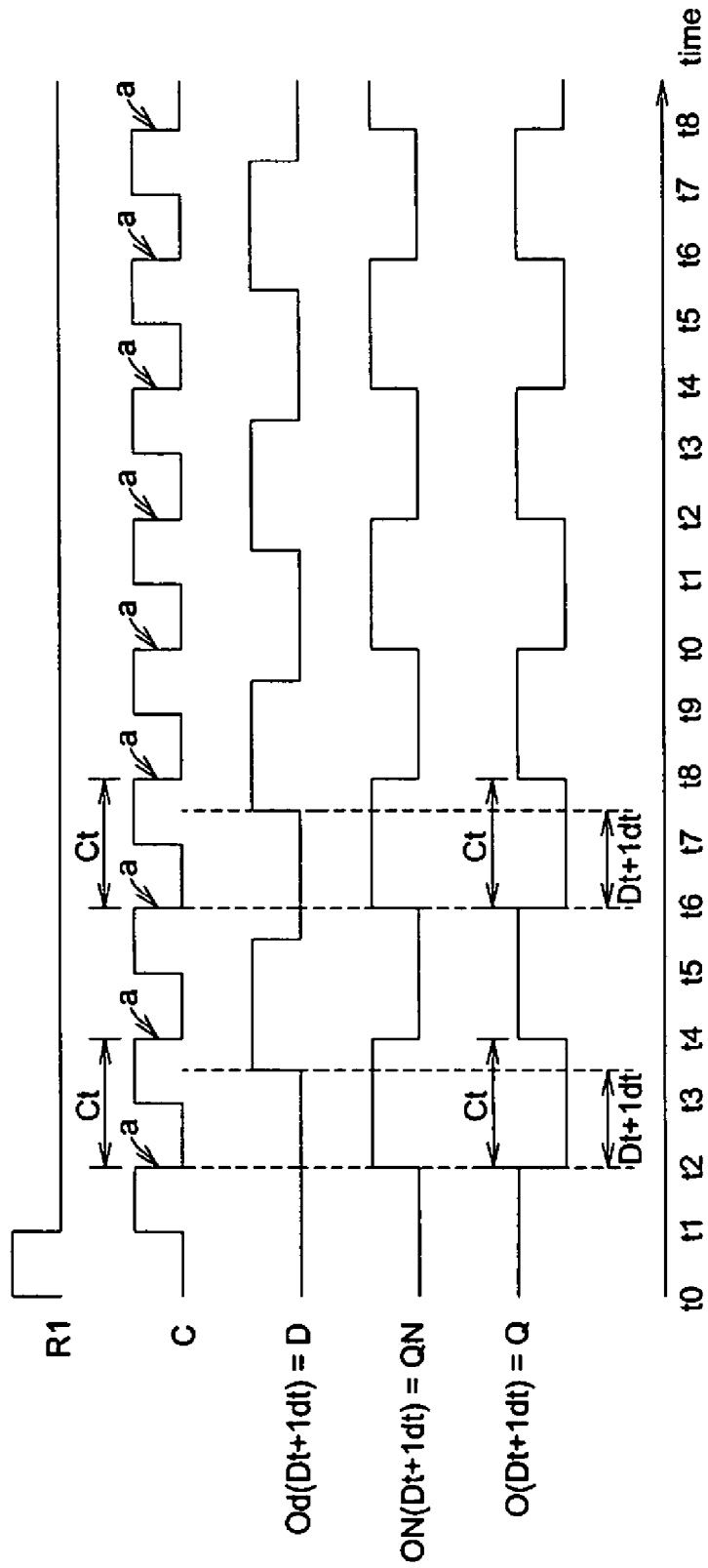
FIGS. 5A–5D show timing diagrams illustrating how the detection system of the invention detects the processing speed of an IC.
Figure 5B:
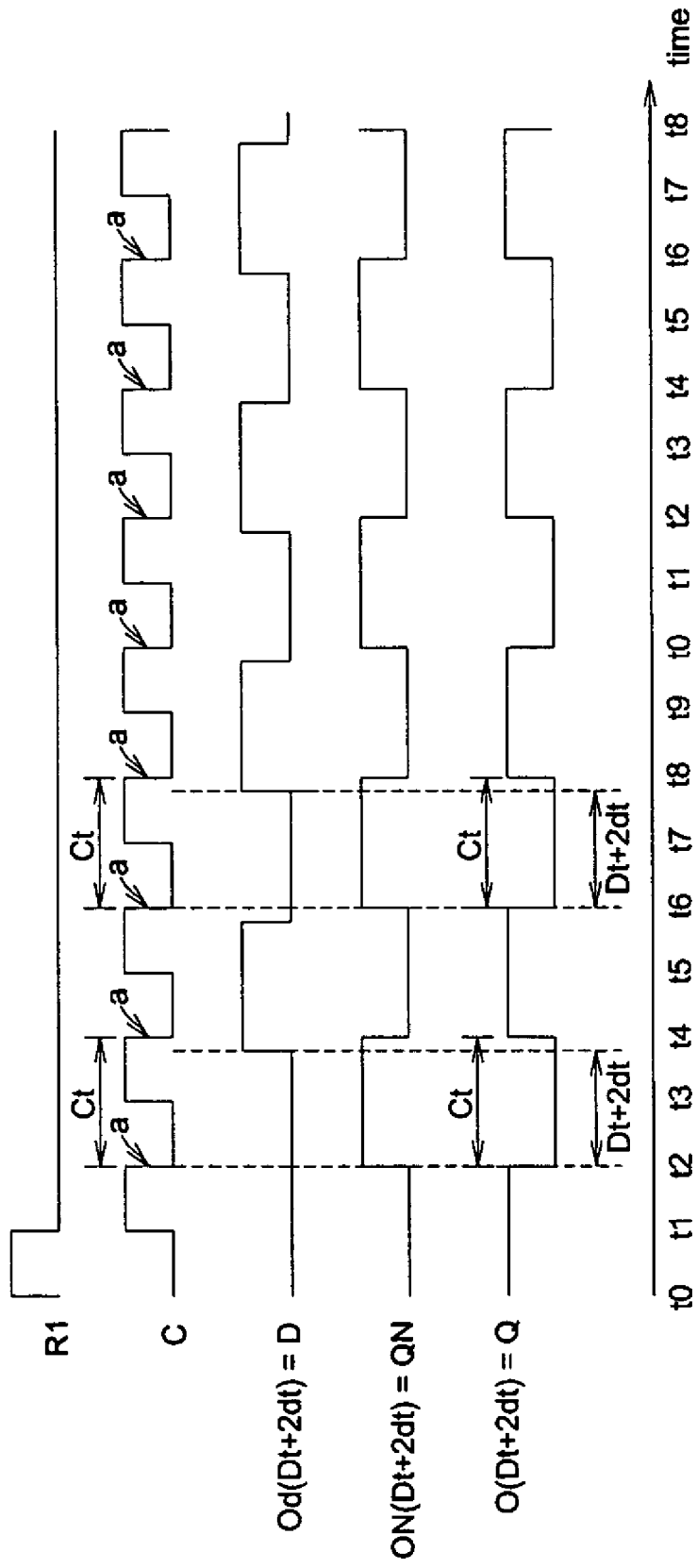
Figure 5C:
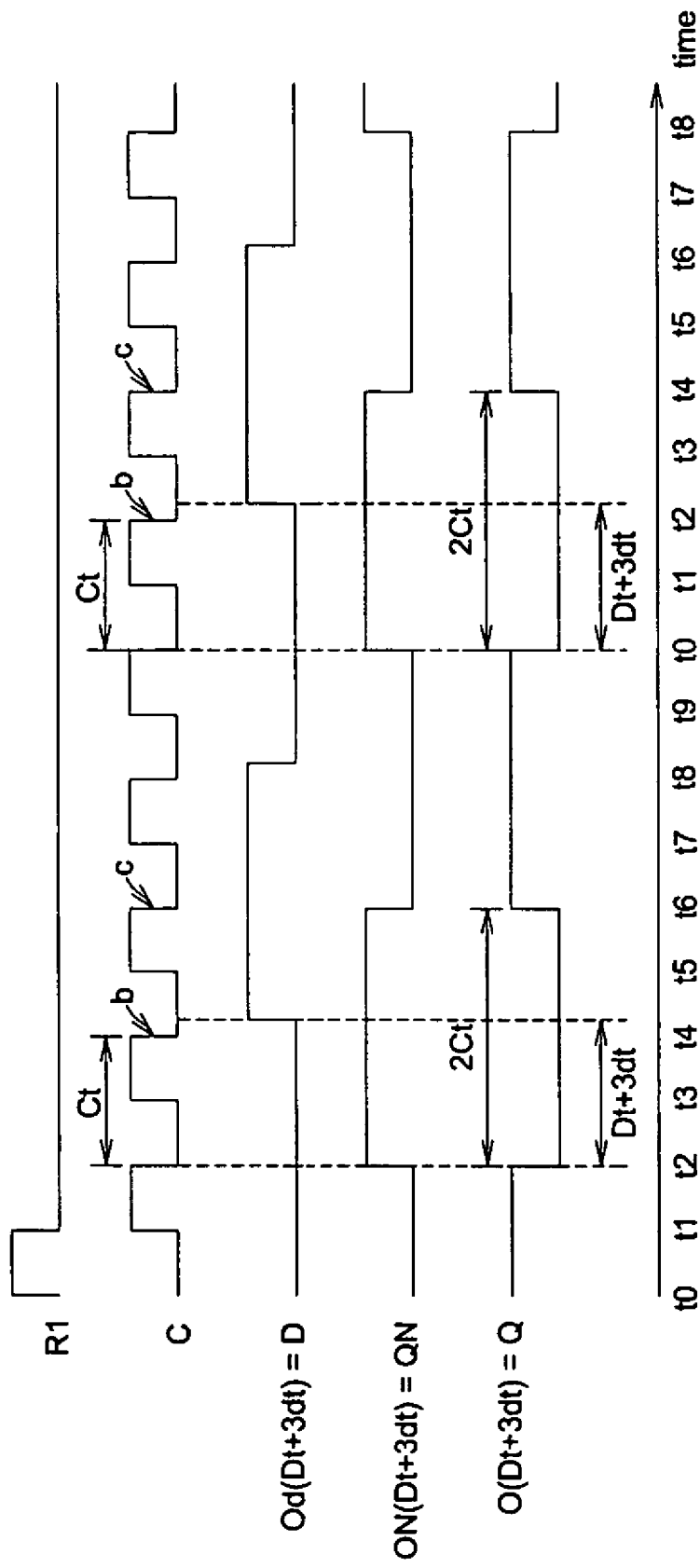

FIGS. 5A–5D show timing diagrams illustrating how the detection system of the invention detects the processing speed of an IC. First, at time t0, a reset signal R1 is fed to a flip-flop 211 from a device external to the IC, so that the output signal O of the flip-flop 211 is set to a high level 1. Meanwhile, a clock signal C used as a trigger clock (falling-edge trigger here) is fed to the flip-flop 211 from an oscillator inside the IC or a device external to the IC, and an inverted output signal ON is outputted by the flip-flop 211 at the same time. Then, a delay unit 212a receives the inverted output signal ON and performs a coarse adjustment of delay time thereon, where the inverted output signal ON is delayed with a period longer than the delay time of a clock-adjusting unit dm to generate a delay clock signal Dt, which is fed to a multiplexer 212b. A clock-adjusting unit d1 receives the delay clock signal Dt and performs a fine adjustment of delay time thereon to generate a clock-adjusting signal T1(=Dt+1dt), which is fed to the multiplexer 212b. As shown in FIG. 5A, the multiplexer 212b receives a first selection signal S1 to choose the clock-adjusting signal T1 and generates a delay signal Od (Dt+1dt), which is fed to the flip-flop 211 via its input port D. Then, the flip-flop 211 outputs an output signal O (Dt+1dt) to a judge unit 22. Referring to FIG. 5A, since the delay time Dt+1dt of the delay signal Od (Dt+1dt) is shorter than the clock period Ct of the clock signal C, the output signal O (Dt+1dt) alters its level as triggered by the clock signal C at a falling edge of the clock signal C (indicated by an arrow a). Also, since the clock period of the output signal O (Dt+1dt) is shorter than that of the clock signal C, the judge unit 22 will disable a judge signal Or. Next, as shown in FIG. 5B, even the delay time of the delay signal Od is increased by 1 dt to become Dt+2dt, it is still shorter than the clock period Ct of the clock signal C. Thus, the output signal O (Dt+2dt) still alters its level as triggered by the clock signal C at the falling edge of the clock signal C (indicated by an arrow a). Also, since the clock period of the output signal O (Dt+2dt) is shorter than that of the clock signal C, the judge unit 22 will disable the judge signal Or. Then, as shown in FIG. 5C, the delay time of the delay signal Od is further increased by 1dt to become Dt+3dt, which is longer than the clock period Ct of the clock signal C, and thus the output signal O (Dt+3dt) is not triggered at a falling edge of the clock signal C (indicated by an arrow b) but triggered at a next falling edge of the clock signal C (indicated by an arrow c) to alter its level from 0 to 1. Also, since the clock period of the output signal O (Dt+3dt) is twice longer than that of the clock signal C, the judge unit 22 will enable the judge signal Or so that the required delay time Dt+3dt for the IC is detected and serves to achieve the same output result of the output signal O of the flip-flop 211. In that case, the required delay time that equals Dt+3dt is in positive correlation to the procession speed to reflect the actual procession speed of the IC.

Figure 5D:
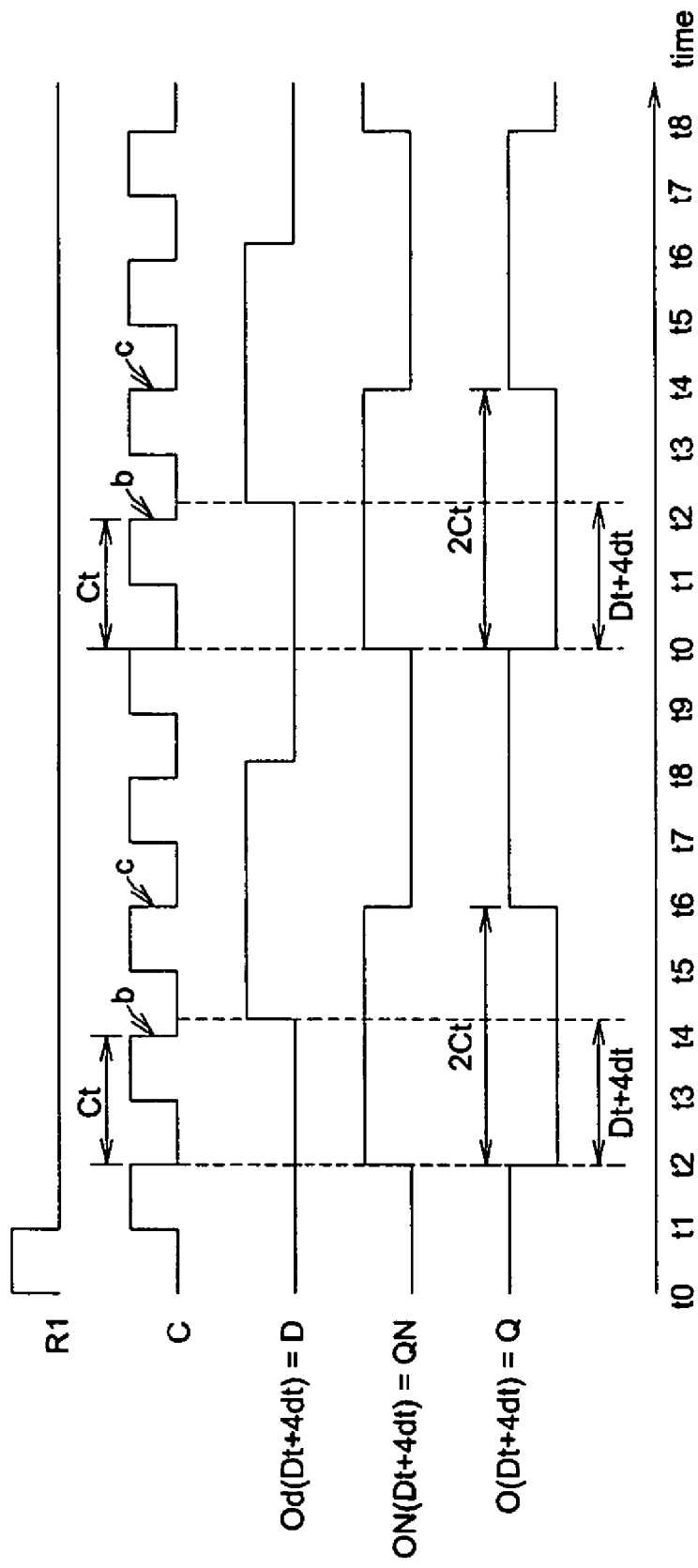

Further, FIG. 5D shows a timing diagram illustrating an embodiment of detecting the processing speed of another IC. Referring to FIG. 5D, the delay time Dt+4dt of the delay signal Od (Dt+4dt) is longer than the clock period Ct of the clock signal C, and thus the output signal O (Dt+4dt) is not triggered at a falling edge of the clock signal C (indicated by an arrow b) but triggered at a next falling edge of the clock signal C (indicated by an arrow c) to alter its level from 0 to 1. Also, as shown in FIG. 5D, the clock period of the output signal O (Dt+4dt) is twice longer than that of the clock signal C. Hence, it can be seen that the IC requires a longer delay time of Dt+4dt to meet the requirement where the clock period of the output signal O (Dt+4dt) is longer than that of the clock signal C.

Comparing the two ICs above, it is seen that the delay time Dt+3dt of the first IC is shorter than the delay time Dt+4dt of the second IC, which means the first IC has a slower processing speed to consume a longer operation time and thus requires a shorter delay time compared to the second IC. Hence, the detection system 20 of the invention may detect the processing speed of an IC according to its delay time, and all the ICs in the same batch can be ranked according to their respective processing speeds by the test results.

Note that it is not necessary for the delay module 212 to choose the same increment of the delay time but to choose it in the most efficient way during the speed detection. For example, the delay time may first extend to Dt+2dt, next extend to Dt+8dt, and then shrink to Dt+6Dt if an excess delay time is detected.

Figure 6:
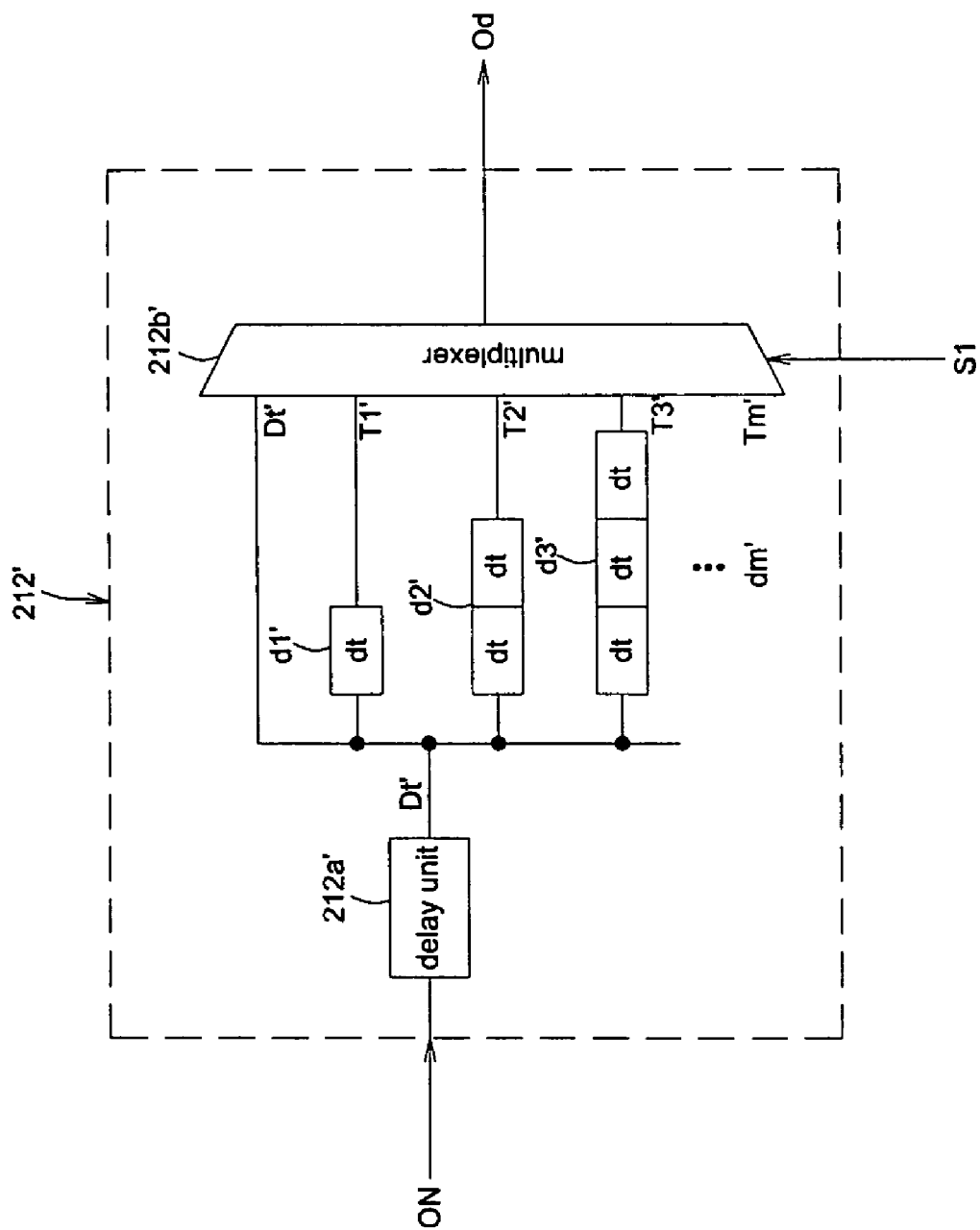
FIG. 6 shows another embodiment of the delay module according to the invention.
Figure 7A:
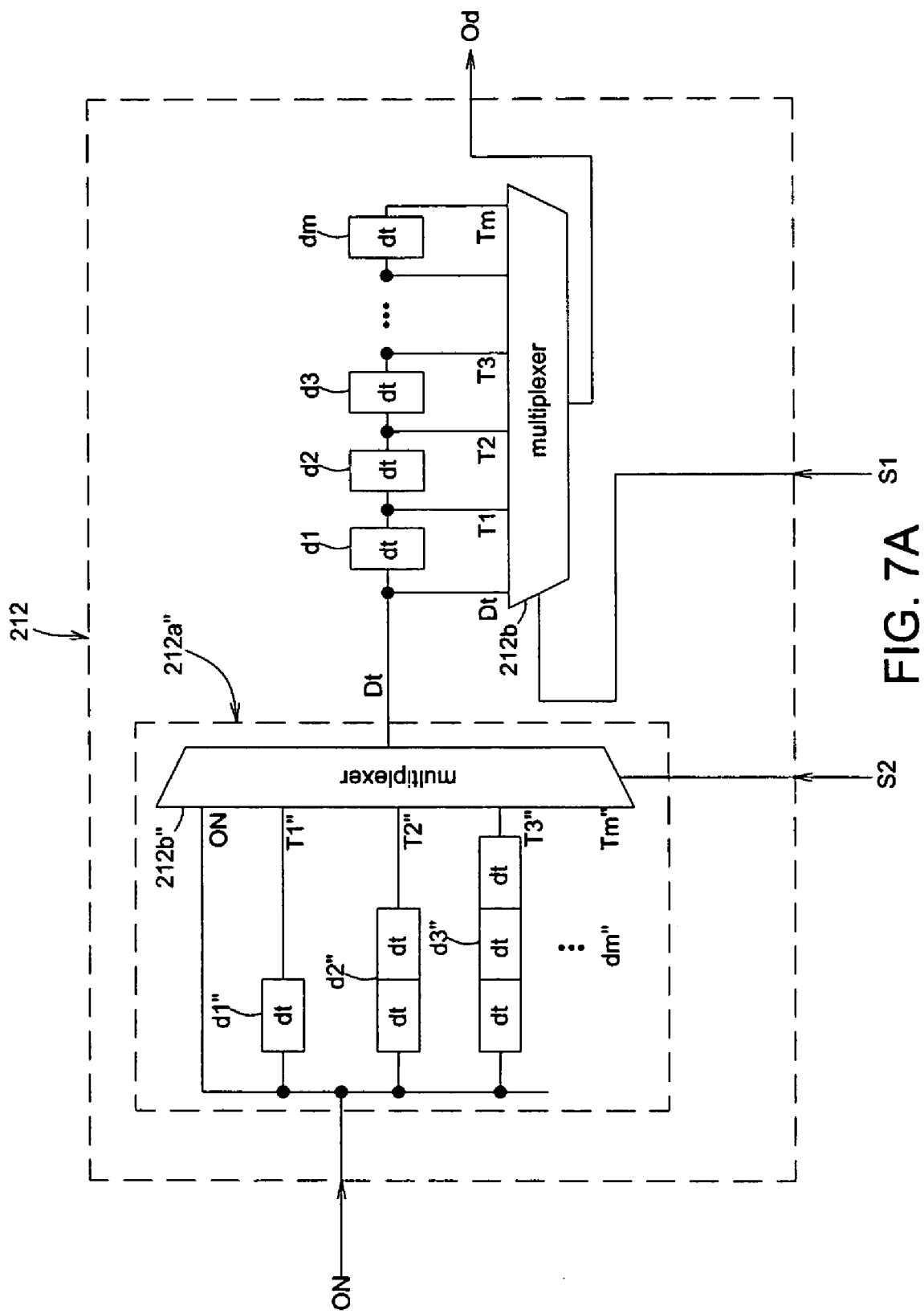
FIG. 7A shows another embodiment of the delay module according to the invention.
Figure 7B:
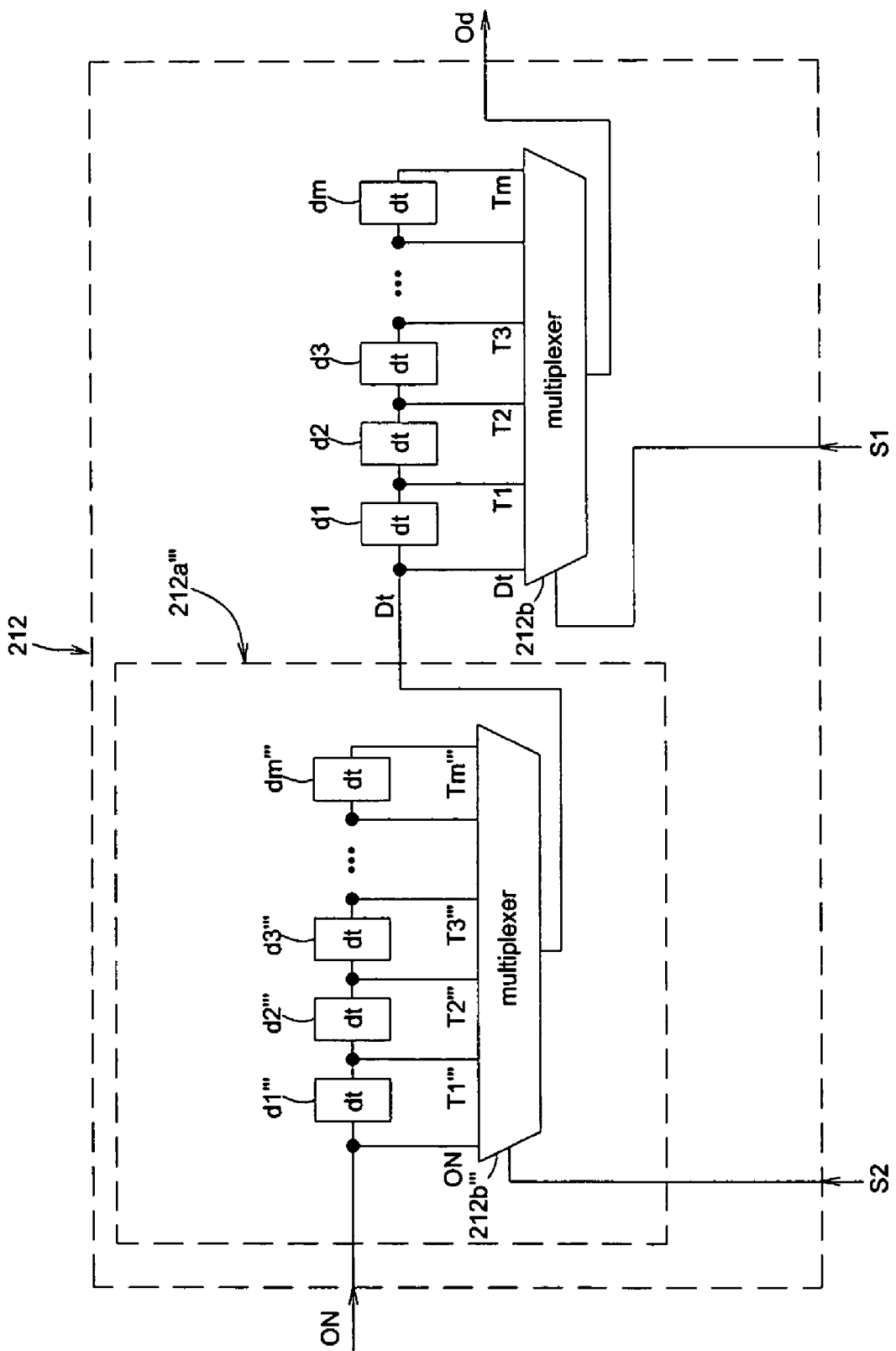
FIG. 7B shows another embodiment of the delay module according to the invention.

FIG. 6 shows another embodiment of the delay module according to the invention. Referring to FIG. 6, the delay module 212' includes a delay unit 212a', m clock-adjusting units (d1', d2', d3' ... dm', where m is a positive integer), and a first multiplexer 212b'. The delay unit 212a' receives and then delays an inverted output signal ON to generate a delay clock signal Dt'. The clock-adjusting units d1'–dm' receive and then delay the delay clock signal Dt'to generate clock-adjusting signals T1'–Tm'. Note that each of the clock-adjusting units has a different delay time. For example, the delay time of the clock-adjusting unit d2' equals 2dt, the delay time of the clock-adjusting unit d3' equals 3dt, and so on. The first multiplexer 212b' receives the delay clock signal Dt' and clock-adjusting signals T1'–Tm' and selects either the delay clock signal Dt' or one of the clock-adjusting signals T1'–Tm' to generate a delay signal Od. Further, in order to obtain a more fine adjustment of the delay time caused by the delay module 212, the delay unit 212a shown in FIG. 3 may be replaced by the delay unit 212a" shown in FIG. 7A or delay unit 212a'" shown in FIG. 7B, where a second selection signal S2 is used in the selection of the delay time. The delay unit 212a" includes m clock-adjusting units (d1", d2", d3" ... dm", where m is a positive integer) and a second multiplexer 212b". The delay unit 212a'" includes m clock-adjusting units (d1'", d2'", d3'" ... dm'", where m is a positive integer) and a second multiplexer 212b'".

Figure 8:
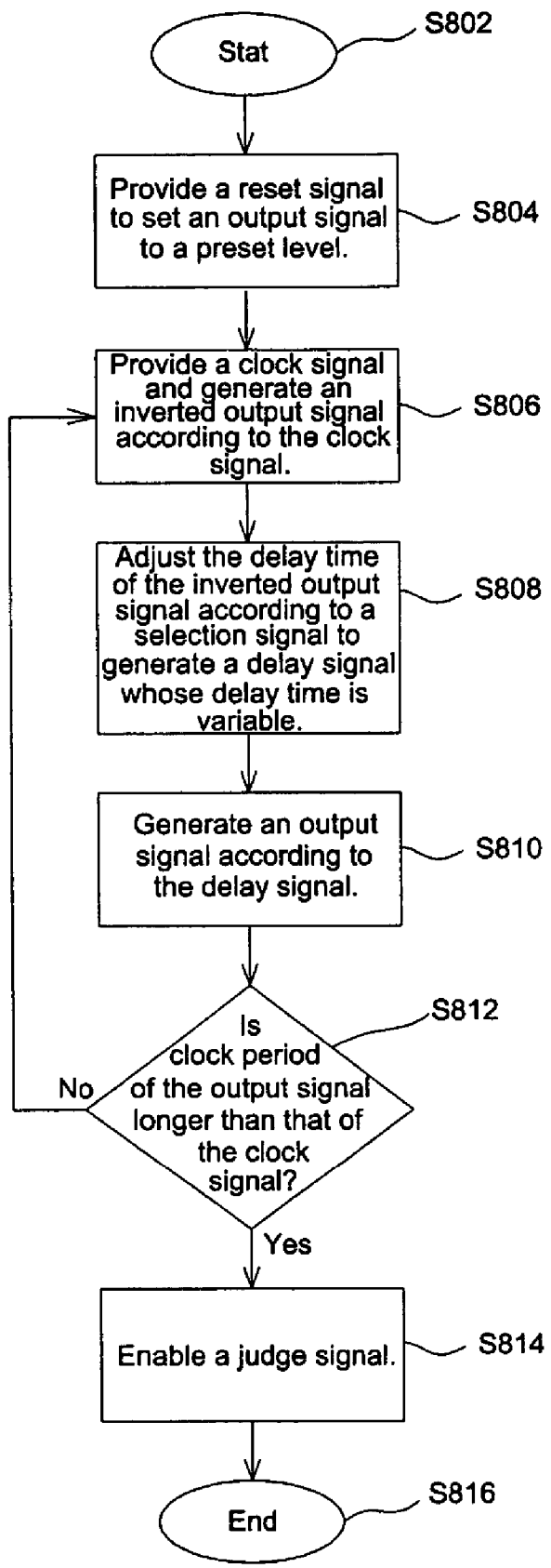
FIG. 8 shows a flowchart illustrating a detection method for detecting the processing speed of an IC according to the invention.

FIG. 8 shows a flowchart illustrating a detection method for detecting the processing speed of an IC. The method includes the steps described below.

Step S802: Stat.

Step S804: Provide a reset signal to set an output signal to a preset level (ether a high level 1 or a low level 0).

Step S806: Provide a clock signal and generate an inverted output signal according to the clock signal. The clock signal may be a rising-edge trigger signal or a falling-edge trigger signal.

Step S808: Adjust the delay time of the inverted output signal according to a selection signal to generate a delay signal whose delay time is variable.

Step S810: Generate an output signal according to the delay signal.

Step S812: Determine whether the clock period of the output signal is longer than that of the clock signal. If no, go back to step S806; if yes, go to the next step.

Step S814: Enable a judge signal.

Step S816: End.

Figure 9:
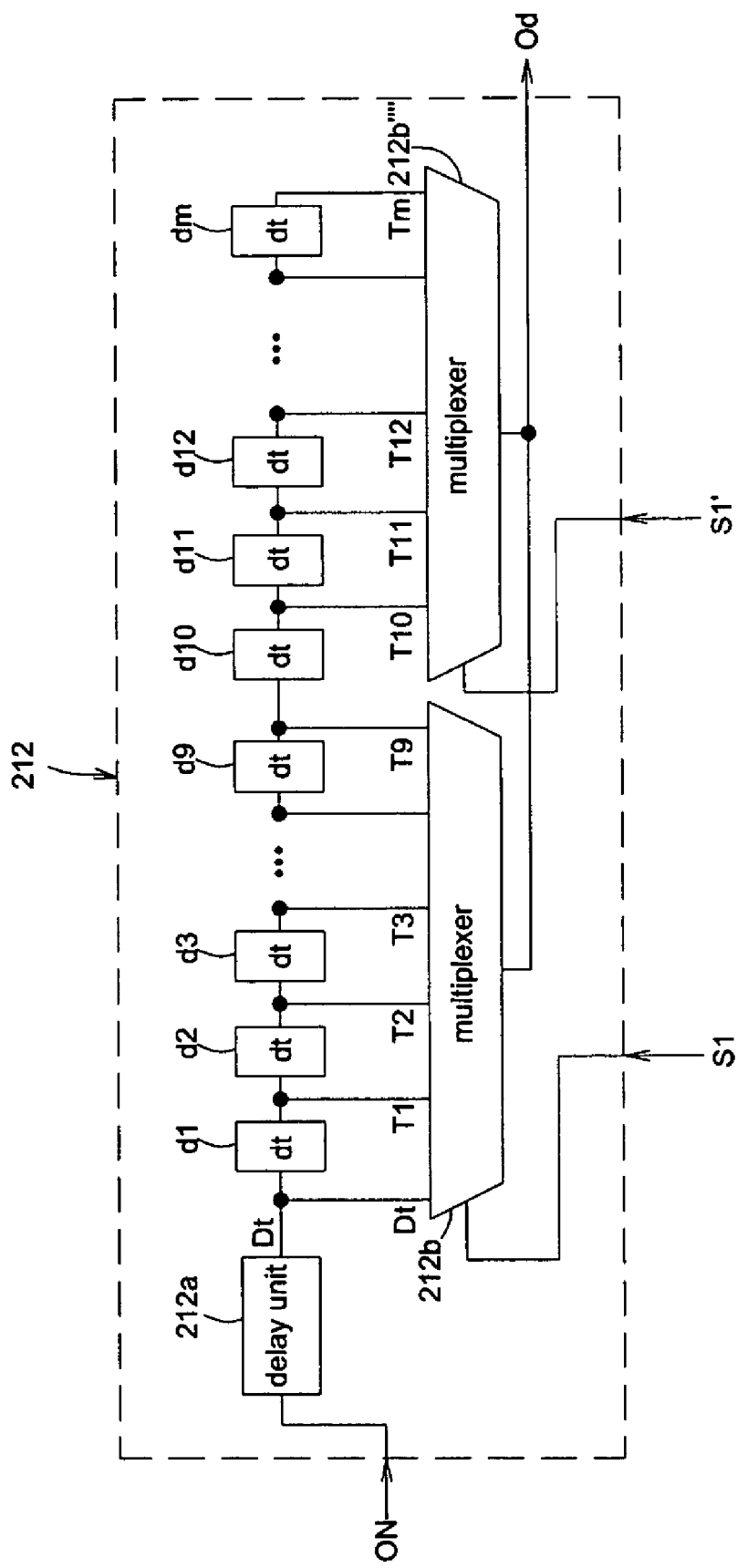
FIG. 9 shows another embodiment of the delay module according to the invention.

While the invention has been described by way of example and in terms of the preferred embodiments, it is to be understood that the invention is not limited to the disclosed embodiments. To the contrary, it is intended to cover various modifications and similar arrangements as would be apparent to those skilled in the art. For example, as shown in FIG. 9, the delay clock signal Dt and the clock-adjusting signals T1–T9 are fed to a multiplexer 212b, and the clock-adjusting signals T0–Tm are fed to another multiplexer 212b''''. That is, the delay clock signal Dt together with the clock-adjusting signals may divided into several groups, and a plurality of multiplexers are provided to receive their respective groups of signals.

Figure 10:
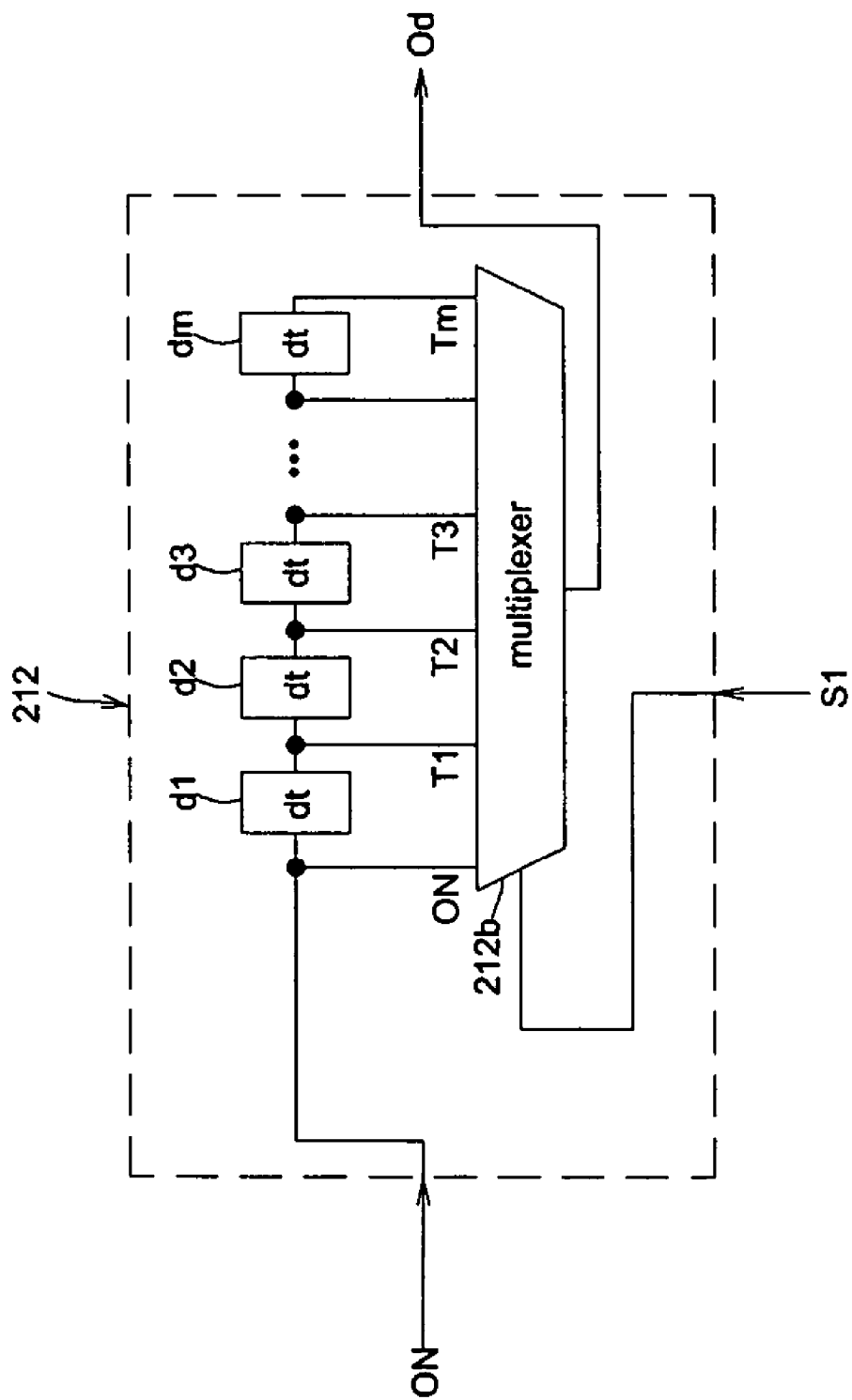
FIG. 10 shows another embodiment of the delay module according to the invention.
Figure 11:
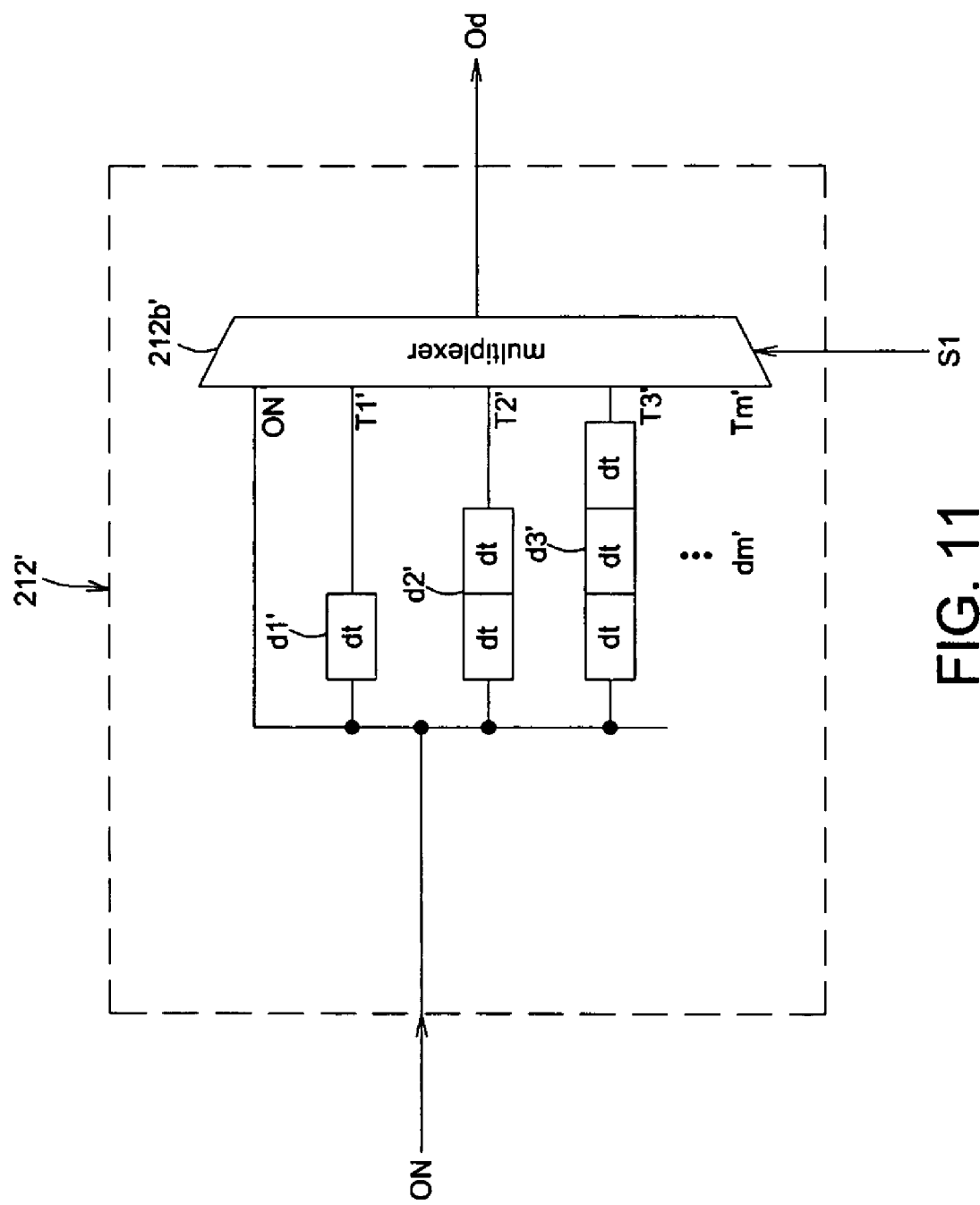
FIG. 11 shows another embodiment of the delay module according to the invention.

Also, as shown in FIG. 10, m clock-adjusting units may direct receive the inverted output signal ON to omit the delay unit 212a shown in FIG. 3. Certainly, as shown in FIG. 11, m clock-adjusting units may direct receive the inverted output signal ON to omit the delay unit 212a' shown in FIG. 6. Therefore, the scope of the appended claims should be accorded the broadest interpretation so as to encompass all such modifications and similar arrangements.

What is claimed is:

1. A detection system for detecting the processing speed of an integrated circuit (IC), comprising:
   a flip-flop for receiving a reset signal that sets an output signal of the flip-flop to a preset level, receiving a clock signal as a trigger signal, and generating an inverted output signal via its inverted output port;
   a delay module for receiving the inverted output signal, adjusting the delay time of the inverted output signal according to a selection signal, and outputting a delay signal whose delay time is variable to the flip-flop to have the flip-flop generate the output signal; and
   a judge unit for receiving the output signal and generating a judge signal, wherein the judge signal is enabled when the clock period of the output signal is longer than the clock period of the clock signal.

2. The detection system according to claim 1, wherein the preset level is a high level 1 or a low level 0, and the clock signal is a rising-edge trigger signal or a falling-edge trigger signal.

3. The detection system according to claim 1, wherein, when the clock period of the output signal is longer than the clock period of the clock signal, the delay time of the delay signal is longer than the clock period of the clock signal and is in positive correlation to the processing speed of the IC.

4. The detection system according to claim 1, wherein the delay module comprises:
   a plurality of clock-adjusting units, each clock-adjusting unit receiving and then delaying the inverted output signal to generate a clock-adjusting signal; and
   at least one multiplexer for receiving the inverted output signal and a plurality of the clock-adjusting signals and selecting either the inverted output signal or one of the clock-adjusting signals according to the selection signal to generate the delay signal.

5. The detection system according to claim 4, wherein the delay module further comprises a delay unit for receiving and then delaying the inverted output signal, and the delay time of the delay unit being longer than the delay time of each clock-adjusting unit.

6. The detection system according to claim 4, wherein the delay times of the clock-adjusting units are different to each other.

7. The detection system according to claim 1, wherein the delay module comprises:
   m clock-adjusting units (m is a positive integer), wherein the $m_{th}$ clock-adjusting unit receives and then delays the $(m-1)_{th}$ clock-adjusting signal output by a $(m-1)_{th}$ clock-adjusting unit to generate the $m_{th}$ clock-adjusting signal, and the first clock-adjusting unit of the m clock-adjusting units receives and then delays the inverted output signal to generate the first clock-adjusting signal; and
   at least one multiplexer for receiving the inverted output signal and m clock-adjusting signals and selecting either the inverted output signal or one of the m clock-adjusting signals according to the selection signal to generate the delay signal.

8. The detection system according to claim 7, wherein the delay module further comprises a delay unit for receiving and then delaying the inverted output signal, and the delay time of the delay unit being longer than the delay time of each clock-adjusting unit.

9. The detection system according to claim 7, wherein the delay times of the clock-adjusting units are identical with each other.

10. A clock output device built inside an IC, comprising:
    a flip-flop for receiving a reset signal that sets an output signal of the flip-flop to a preset level, receiving a clock signal as an trigger signal, and generating an inverted output signal via its inverted output port; and
    a delay module for receiving the inverted output signal, adjusting the delay time of the inverted output signal according to a selection signal, and outputting a delay signal whose delay time is variable to the flip-flop to have the flip-flop generate the output signal;
    wherein, when the clock period of the output signal is longer than the clock period of the clock signal, the delay time of the delay signal is in positive correlation to the processing speed of the IC.

11. The clock output device according to claim 10, wherein the preset level is a high level 1 or a low level 0, and the clock signal is a rising-edge trigger signal or a falling-edge trigger signal.

12. The clock output device according to claim 10, wherein, when the clock period of the output signal is longer than the clock period of the clock signal, the delay time of the delay signal is longer than the clock period of the clock signal.

13. A method for detecting the processing speed of an IC, comprising the steps of:
    providing a clock signal and generating an inverted output signal according to the clock signal;
    adjusting the delay time of the inverted output signal to generate an output signal;
    enabling a judge signal when the clock period of the output signal is longer than the clock period of the clock signal, and disabling the judge signal when the clock period of the output signal is shorter than the clock period of the clock signal.

14. The detection method according to claim 13, wherein the clock signal is a rising-edge trigger signal or a falling-edge trigger signal.

15. The detection method according to claim 13, wherein, when the clock period of the output signal is longer than the clock period of the clock signal, the delay time is in positive correlation to the processing speed of the IC.

16. The detection method according to claim 13, wherein the delay time of the inverted output signal is adjusted according to a selection signal.

* * * * *